United States Patent [19]
Jun et al.

[11] Patent Number: 5,780,317
[45] Date of Patent: Jul. 14, 1998

[54] APPARATUS FOR FORMING OXIDE FILM OF SEMICONDUCTOR DEVICE

[75] Inventors: Yong-min Jun; Jae-man Jang; Sang-kook Choi; Chan-sik Park, all of Suwon, Rep. of Korea

[73] Assignee: Samsung Electronics Co., Ltd., Suwon, Rep. of Korea

[21] Appl. No.: 773,061

[22] Filed: Dec. 24, 1996

[51] Int. Cl.$^6$ .................... H01L 21/66; G01R 31/26
[52] U.S. Cl. .................................................. 438/16
[58] Field of Search ................... 438/16; 356/355, 356/356, 357, 358

[56] References Cited

U.S. PATENT DOCUMENTS

| | | | |
|---|---|---|---|
| 4,141,780 | 2/1979 | Kleinknecht et al. | 438/16 |
| 5,131,752 | 7/1992 | Yu et al. | 356/369 |

FOREIGN PATENT DOCUMENTS 60-4223  6/1983  Japan.

*Primary Examiner*—Brian Dutton
*Attorney, Agent, or Firm*—Jones & Volentine, L.L.P.

[57] ABSTRACT

An oxidizing apparatus and a method for forming an oxide film by controlling the oxide film growth using the same are provided. The apparatus includes an oxide film growing means, oxide film thickness measuring means and controlling means in order to form an oxide film of a desired thickness on a wafer. Here, the controlling means automatically calculates the oxide film growing time corresponding to a target thickness of an oxide film to be grown on the wafer. Accordingly, operation is simplified and a differing thicknesses of the oxide film in each batch is minimized, to thereby enhance reliability with respect to a process and produce uniform product.

3 Claims, 3 Drawing Sheets

APPARATUS FOR FORMING OXIDE FILM OF SEMICONDUCTOR DEVICE

BACKGROUND OF THE INVENTION

The present invention relates to an apparatus and a method of manufacturing semiconductor device, and more particularly, to an oxidizing apparatus and a method for forming an oxide film of desired thickness on a semiconductor wafer using the same.

FIG. 1 is a flowchart illustrating a method for forming an oxide film in a conventional semiconductor device. The time required for growing an oxide film corresponding to the target thickness of an oxide film to be formed on a wafer is determined in step S10 and the oxide film is grown in an oxidizing apparatus for the predetermined duration in step S11. The thickness of the oxide film grown on the wafer is measured using a measuring apparatus of oxide film thickness in step S12, and then the measured thickness is compared with the target thickness in step S13. If the target thickness has not been satisfied in step S13, the time required for growing more oxide film is calculated and steps S10–S12 are repeated until the measured thickness corresponds to the target thickness.

In the above-mentioned conventional process of forming an oxide film, due to various conditions of the oxidizing apparatus itself, the thickness of the oxide film is different in each batch. When the target thickness of the oxide film is not met, the time for growing the oxide film must be manually calculated in order to grow an oxide film of desired thickness.

Also, a method of calculating the time for growing the oxide film may differ such that each calculation is not uniform, and further the results of each batch must be identified and recorded.

SUMMARY OF THE INVENTION

Accordingly, it is an object of the present invention to provide an oxidizing apparatus for minimizing differences in oxide film thicknesses grown in a batch by the manually calculated time for growing the oxide film.

It is another object of the present invention to provide a method of forming an oxide film using the oxidizing apparatus.

To accomplish the above first object of the present invention, there is provided an apparatus for forming an oxide film of a semiconductor device, comprising: controlling means for calculating a time required for growing an oxide film of desired thickness, based on a target thickness input from an operator terminal and a measured thickness of an oxide film grown in a previous oxidation process, and outputting the required time for growing the oxide film; oxide film growing means for receiving the required time output from the controlling means and growing an oxide film for the required time; and oxide film thickness measuring means for measuring a thickness of the oxide film grown in the oxide film growing means and inputting the measured thickness to the controlling means.

To accomplish the above second object of the present invention, there is provided a method for forming an oxide film of a semiconductor device, comprising the steps of: a) inputting a target thickness of an oxide film to be formed into a controlling means and calculating a time required for growing an oxide film corresponding to the target thickness with the controlling means; b) inputting the time into an oxide film growing means and then growing an oxide film for the time; c) measuring the thickness of the grown oxide film in an oxide film thickness measuring means and then inputting the measured thickness into the controlling means; d) comparing the target thickness with the measured thickness and calculating the time for growing an oxide film corresponding to difference between the target thickness and the measured thickness in the controlling means; and e) inputting the time for growing an oxide film calculated in the step d) into the oxide film growing means and then repeating the steps from step b) until the target thickness corresponds to the measured thickness.

According to the apparatus of the present invention and a method of forming an oxide film using the same, the time for growing the oxide film corresponding to the target thickness of the oxide film to be grown is automatically calculated, to thereby simplify the process and minimize differences in the oxide film thicknesses. Accordingly, reliability with respect to the process is enhanced and the product can be more uniformly produced.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
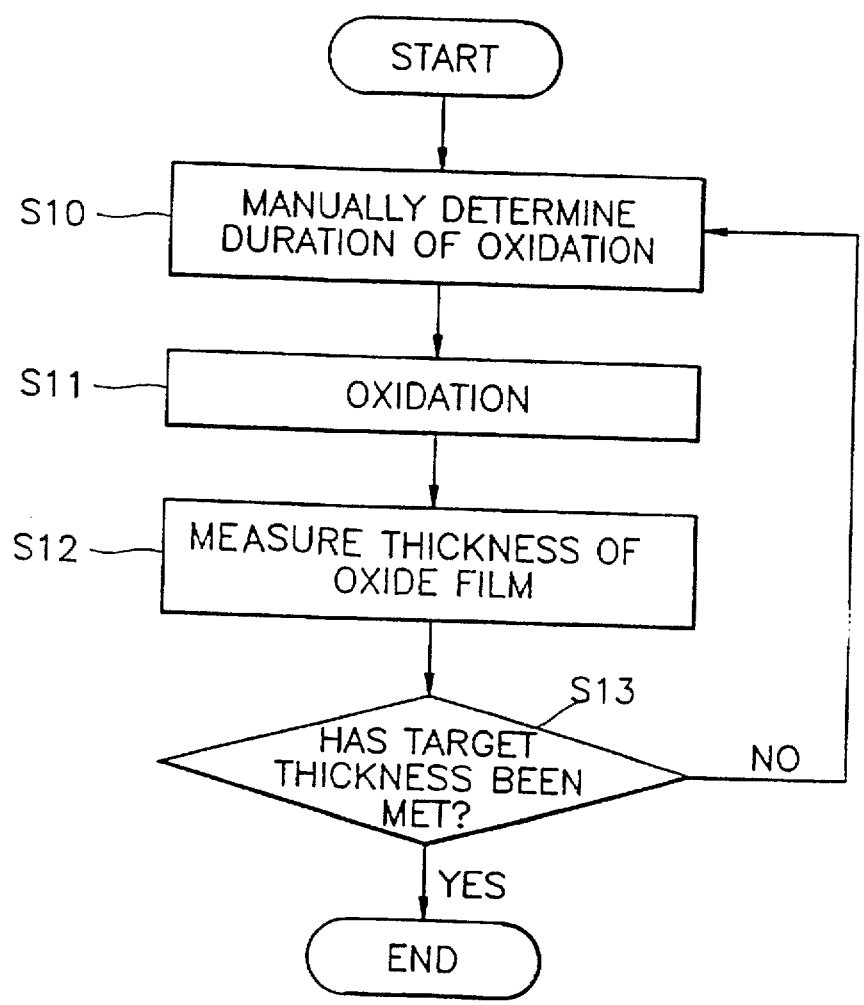
FIG. 1 is a flowchart illustrating a method for forming an oxide film in a conventional semiconductor device.
Figure 2:
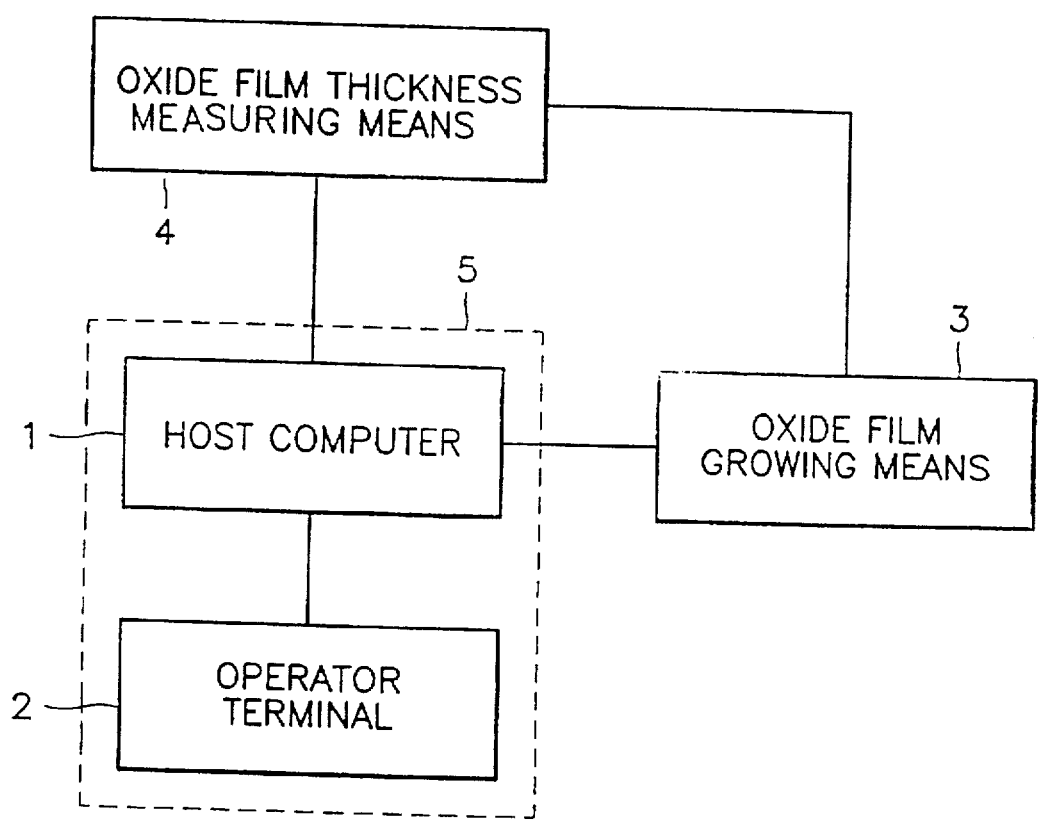
FIG. 2 is a block diagram of an apparatus for forming an oxide film of a semiconductor device according to the present invention.

Referring to FIG. 2, reference numeral 3 refers to an oxide film growing means and reference numeral 4 refers to an oxide film thickness measuring means, respectively.

Reference numeral 5 refers to a controlling means which includes a host computer 1 for storing, comparing and calculating data and a terminal 2.

When either the target thickness of the oxide film to be grown on the wafer or the measured thickness of the oxide film grown on the wafer is input into the host computer 1 through the terminal 2, the host computer 1 calculates either the time required for growing an oxide film for growing the target thickness or the time required for growing an oxide film corresponding to the difference between the target thickness and the measured thickness, where the target thickness is thicker than that of the measured thickness, and then outputs the calculated time to the terminal 2.

The time for growing an oxide film is determined from the stored data of oxide film growth rates obtained from repeated oxidation process in the means for growing the oxide film. The oxide film growing means 3 receives the predetermined time required for growing the desired thickness of an oxide film from the controlling means 5 and then grows the oxide film for predetermined time. Then, the oxide film thickness measuring means 4 measures the thickness of the oxide film and the measured thickness is fed back to the host computer 1 of the controlling means 5.

Figure 3:
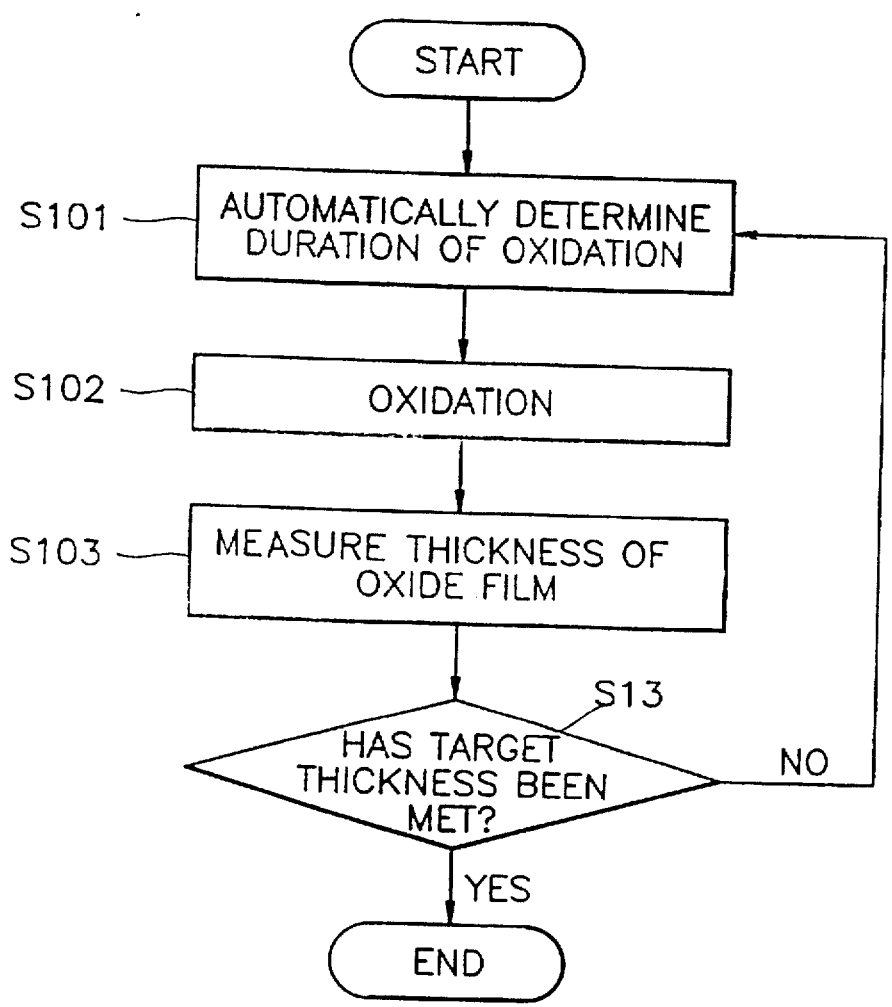
FIG. 3 is a flowchart illustrating a method for forming an oxide film of a semiconductor device using the apparatus of FIG. 2.

Referring to FIG. 3, the time for growing an oxide film corresponding to the target thickness of the oxide film to be grown on the wafer is determined using the controlling means 5 in step S101 and the oxide film is grown in the oxide film growing means 3 for the predetermined time in step S102. Next, the oxide film thickness measuring means 4 measures the thickness of the oxide film grown on the wafer during the oxidation process in step S103 and then the controlling means compares the measured thickness with the target thickness. Here, in step S104, the controlling means 5 determines whether the target thickness has been met. If the target thickness is thicker than the measured thickness, the steps S101–S103 are repeated.

The formulas used for calculating the time for growing an oxide film stored in the controlling means are as follows:

$$t = (t_1'R) + |t_2'(1 - R)| \quad (1)$$

$$t_1' = t_1 - \frac{(TOX_{avg.1} - T)}{G_1} \quad (2)$$

$$t_2' = t_2 - \frac{(TOX_{avg.2} - T)}{G_2} \quad (3)$$

$$R = \frac{t_1'}{t_2' + t_1'} \quad (4)$$

wherein t is the time required for next growth of oxide film, $t_1$, is the duration of growth of current batch, $t_2$ is the duration of growth of previous batch, $TOX_{avg.1}$ and $TOX_{avg.2}$ are the average thicknesses of the oxide grown during $t_1$ and $t_2$, respectively, T is the target thickness and $G_1$ and $G_2$ are the respective growth rates of the oxide during $t_1$ and $t_2$.

Here, $TOX_{avg.1}$ and $TOX_{avg.2}$ are calculated with the largest and the smallest measured values being discarded. Also, when the difference between the largest data and the smallest data is larger than a predetermined span value, S (S=x% of T), the averages $TOX_{avg.1}$ and $TOX_{avg.2}$ are replaced by the span value S. When the change in measured thicknesses of the oxide film is large and the time for growing the oxide film is calculated using the above formulas, process failure may occur. Thus, the operator predetermines the span value after repeated processes.

According to the oxidizing apparatus and the method of forming an oxide film of the present invention, the time for growing an oxide film corresponding to the target thickness of the oxide film to be grown is calculated automatically, using the oxidizing apparatus having an oxide film growing means, the oxide film thickness measuring means and controlling means. Accordingly, the operation is simplified and varying oxide film thicknesses in a batch are minimized, to thereby enhance the reliability with respect to the process and produce more uniform products.

It should be understood that the invention is not limited to the illustrated embodiment and that many changes and modifications can be made within the scope of the invention by a person skilled in the art.

What is claimed is:

1. A method for forming an oxide film of a semiconductor device, comprising the steps of:

a) inputting a target thickness of an oxide film to be formed into controlling means and calculating a time required for growing an oxide film corresponding to said target thickness with said controlling means;

b) inputting the time into oxide film growing means and then growing an oxide film for the time;

c) measuring the thickness of the grown oxide film in oxide film thickness measuring means and then inputting the measured thickness into said controlling means;

d) comparing said target thickness with said measured thickness and calculating the time for growing an oxide film corresponding to difference between said target thickness and said measured thickness in said controlling means; and e) inputting the time for growing an oxide film calculated in said step d) into said oxide film growing means and then repeating said steps from step b) until said target thickness corresponds to said measured thickness.

2. A method for forming an oxide film of a semiconductor device according to claim 1, wherein the time, t, required for growing said oxide film can be expressed as $t=(t_1'R)+|t_2'(1-R)|$ wherein, $$t_1' = t_1 - \frac{(TOX_{avg.1} - T)}{G_1},$$

$$t_2' = t_2 - \frac{(TOX_{avg.2} - T)}{G_2}, \text{ and}$$

$$R = \frac{t_1'}{t_2' + t_1'},$$

in which $t_1'$ and $t_2'$ are values obtained during times $t_1$ and $t_2$ for growing oxide films in previous stages, $TOX_{avg.1}$ and $TOX_{avg.2}$ represent the average thicknesses of the oxide grown during the times $t_1$ and $t_2$, respectively, T represents said target thickness and $G_1$ and $G_2$ are the respective growth rates of the oxide during the times $t_1$ and $t_2$.

3. A method for forming an oxide film of a semiconductor device according to claim 2, wherein an span value S determined by an operator is used in place of $TOX_{avg.1}$ and $TOX_{avg.2}$ when a difference between a greatest value and a smallest value of data of said measured thicknesses of the grown oxide film is larger than said span value S, wherein S=x % of T.

* * * * *